(12) United States Patent
Wagner et al.

(10) Patent No.: US 10,283,946 B2
(45) Date of Patent: May 7, 2019

(54) SWITCH CABINET WITH A COMBINATION CABLE AND AIR CHANNEL

(71) Applicant: RITTAL GMBH & CO. KG, Herborn (DE)

(72) Inventors: Steffen Wagner, Burbach (DE); Christine Ronzheimer, Dautphetal-Herzhausen (DE); Joerg Knetsch, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 149 days.

(21) Appl. No.: 14/392,064

(22) PCT Filed: Feb. 3, 2014

(86) PCT No.: PCT/DE2014/100027
§ 371 (c)(1),
(2) Date: Jul. 30, 2015

(87) PCT Pub. No.: WO2014/124631
PCT Pub. Date: Aug. 21, 2014

(65) Prior Publication Data
US 2015/0380911 A1    Dec. 31, 2015

(30) Foreign Application Priority Data

Feb. 15, 2013    (DE) .......................... 10 2013 101 507

(51) Int. Cl.
*H02B 1/56* (2006.01)
*H02G 3/04* (2006.01)
(Continued)

(52) U.S. Cl.
CPC ............. *H02B 1/565* (2013.01); *H02B 1/306* (2013.01); *H02B 1/32* (2013.01); *H02G 3/045* (2013.01);
(Continued)

(58) Field of Classification Search
CPC ..................................................... H02B 1/306
(Continued)

(56) References Cited

U.S. PATENT DOCUMENTS 2,302,395 A * 11/1942 Seaman ................... H02B 1/56
174/16.1
3,192,306 A * 6/1965 Skonnord .......... H05K 7/20572
165/80.3
(Continued)

FOREIGN PATENT DOCUMENTS

CH       690392 A5    8/2000
CN       1185049 A    6/1998
(Continued)

*Primary Examiner* — Gregory L Huson
*Assistant Examiner* — Frances F. Hamilton
(74) *Attorney, Agent, or Firm* — Marshall & Melhorn, LLC

(57) ABSTRACT

The invention relates to a combination cable and air channel for air conditioning an electrical enclosure, comprising an air channel and a cable channel which adjoins the air channel and which is led parallel to the air channel. A first longitudinal face of the air channel has at least one opening, and a longitudinal face of the cable channel manner. The invention further relates to a corresponding electrical enclosure.

18 Claims, 3 Drawing Sheets

(51) Int. Cl.
  *H05K 7/20* (2006.01)
  *H02B 1/30* (2006.01)
  *H02B 1/32* (2006.01)

(52) U.S. Cl.
  CPC ..... *H05K 7/20145* (2013.01); *H05K 7/20181* (2013.01); *H05K 7/20909* (2013.01)

(58) Field of Classification Search
  USPC .......................................................... 454/184
  See application file for complete search history.

(56) References Cited

U.S. PATENT DOCUMENTS

| | | | | | |
|---|---|---|---|---|---|
| 3,705,949 | A | * | 12/1972 | Weiss | H02G 3/045 174/101 |
| 4,118,755 | A | * | 10/1978 | Davies | H02B 1/56 174/16.1 |
| 5,529,120 | A | * | 6/1996 | Howard | H05K 7/206 165/104.33 |
| 5,684,674 | A | * | 11/1997 | Yin | G06F 1/20 248/309.1 |
| 5,728,976 | A | * | 3/1998 | Santucci | H02G 3/0418 174/135 |
| 5,794,895 | A | * | 8/1998 | Besserer | H02B 1/202 248/73 |
| 6,304,698 | B1 | * | 10/2001 | Morris | G02B 6/4459 138/111 |
| 6,643,123 | B2 | * | 11/2003 | Hartel | H02B 1/565 165/80.3 |
| 7,085,455 | B2 | * | 8/2006 | Morris | G02B 6/4459 138/111 |
| 7,095,606 | B2 | * | 8/2006 | Mahn | H02B 13/025 220/89.1 |
| 7,336,484 | B2 | * | 2/2008 | McAnally | G06F 1/183 174/79 |
| 7,378,046 | B2 | * | 5/2008 | Canty | G02B 6/4459 264/318 |
| 7,635,020 | B2 | * | 12/2009 | Hartel | H02B 1/565 165/157 |
| 7,855,885 | B2 | * | 12/2010 | Adducci | H05K 7/186 211/26 |
| 8,511,627 | B2 | * | 8/2013 | Lutze | H02B 1/32 211/70.6 |
| 8,540,191 | B2 | * | 9/2013 | Sabadie | B64C 1/406 244/117 R |
| 8,710,369 | B2 | * | 4/2014 | Krietzman | H05K 7/18 174/68.3 |
| 9,814,150 | B2 | * | 11/2017 | Krietzman | H05K 7/18 |
| 2003/0035264 | A1 | * | 2/2003 | Hartel | H02B 1/565 361/678 |
| 2003/0189394 | A1 | * | 10/2003 | Hartel | H02B 1/32 312/265.4 |
| 2005/0082239 | A1 | * | 4/2005 | Laurosch | A47B 21/06 211/26 |
| 2005/0193930 | A1 | * | 9/2005 | Hartel | A47B 83/001 108/106 |
| 2006/0044766 | A1 | * | 3/2006 | Hartel | H02B 1/20 361/724 |
| 2006/0138062 | A1 | * | 6/2006 | Dahmer | H02B 1/301 211/26 |
| 2006/0162946 | A1 | * | 7/2006 | Hartel | H02B 1/565 174/9 F |
| 2008/0218042 | A1 | * | 9/2008 | Hartel | H02B 1/301 312/265.4 |
| 2009/0025954 | A1 | * | 1/2009 | Stock | E05D 5/0215 174/61 |
| 2009/0250560 | A1 | * | 10/2009 | Chou | F16L 3/26 248/49 |
| 2010/0116945 | A1 | * | 5/2010 | Lutze | H02B 1/32 248/65 |
| 2010/0221075 | A1 | * | 9/2010 | Petrovic | B65G 51/035 406/194 |
| 2011/0036961 | A1 | * | 2/2011 | Chowaniec | H05K 7/1484 248/309.1 |
| 2011/0309196 | A1 | * | 12/2011 | Sabadie | B64C 1/406 244/131 |
| 2012/0071082 | A1 | * | 3/2012 | Karamanos | F24F 5/0003 454/284 |
| 2012/0300422 | A1 | * | 11/2012 | Sun | G06F 1/183 361/759 |
| 2013/0029581 | A1 | * | 1/2013 | Hartmann | F04D 29/646 454/283 |
| 2013/0032583 | A1 | * | 2/2013 | Epperlein | B23K 26/0876 219/121.86 |
| 2016/0278243 | A1 | * | 9/2016 | Bach | H05K 7/20736 |

FOREIGN PATENT DOCUMENTS

| | | | | |
|---|---|---|---|---|
| CN | 1185049 | A | * | 6/1998 |
| CN | 1375071 | A | | 10/2002 |
| CN | 2652000 | Y | * | 10/2004 |
| CN | 2652000 | Y | | 10/2004 |
| CN | 201413959 | Y | | 2/2010 |
| CN | 201413959 | Y | * | 2/2010 ............... H02G 3/04 |
| DE | 3107683 | A1 | | 9/1982 |
| DE | 4413124 | A1 | | 11/1995 |
| DE | 4413124 | A1 | * | 11/1995 ............. H02B 1/202 |
| DE | 19728306 | A1 | | 1/1999 |
| DE | 102009054011 | A1 | | 5/2011 |
| DE | 102011015547 | B3 | | 6/2012 |
| EP | 2110913 | A2 | * | 10/2009 ............ H02G 3/0418 |
| FR | 2691227 | A1 | | 11/1993 |
| JP | 10126918 | A | * | 5/1998 |
| WO | WO 9952189 | A1 | * | 10/1999 ............. H02G 3/045 |

\* cited by examiner

SWITCH CABINET WITH A COMBINATION CABLE AND AIR CHANNEL

BACKGROUND OF THE INVENTION

The invention concerns a combination cable and air channel for air conditioning an electrical enclosure, specifically a switch cabinet, and a corresponding switch cabinet.

DE 10 2009 054 011 B4 describes a switch cabinet with a wall element for the specific cooling of heat-producing components contained in the switch cabinet, wherein the wall element separates the interior space of the switch cabinet containing the heat-producing components from a cooling air space. In the cooling air space, air cooled by means of an air conditioner is provided for the cooling of the heat-producing components. The interior of the switch cabinet and the cooling air space are in fluidic connection by a plurality of passageways in the wall element, wherein cooled air from the cooling air space is led through the passageways into the interior of the switch cabinet. A similar switch cabinet is also described by DE 197 28 306 A1.

In switch cabinets of this kind, components which become heated on account of their dissipated power and which require cooling are often arranged on a mounting plate more or less in one plane above and next to each other. The switch cabinet familiar from the cited publication has a warm air outlet and a cold air inlet spaced apart from each other in the vertical direction for the cooling of the components. Through the warm air outlet, which is often situated in the upper region of the switch cabinet in the case of wall-mounted devices, warm air is carried away from the interior space of the switch cabinet, led through a heat exchanger of a cooling unit, where it is cooled, and blown as cold air through the cold air inlet, often situated in the lower region of the switch cabinet, into the switch cabinet.

Due to the relative arrangement between air inlet and air outlet, a temperature gradient from top to bottom is established in the interior space of the switch cabinet. The air blown in streams in the vertical direction from bottom to top, so that the lower situated components receive the flow of the coolest air, while components above them are in the flow of air already heated by the heat given off by the lower situated components. Furthermore, components situated further up on account of the vertical direction of air flow are in the leeward area of lower situated components, which further worsens the cooling of the higher situated components. Thus, it can occur that peak temperatures are reached in the upper region of the switch cabinet, which are higher than an upper limit temperature for the average switch cabinet temperature.

The above described temperature distribution inside the switch cabinet means that when installing the components it is necessary to arranged the more temperature sensitive components or those in greater need of cooling in the lower area of the switch cabinet, while less temperature sensitive components can also be arranged in the upper area of the switch cabinet. But this has the drawback that, first of all, the space available in the switch cabinet is often not used optimally, for example given the form factor of the components, and on the other hand it is sometimes necessary to provide extensive electrical wiring between components which, though electrically interconnected, are situated far apart. This not only impairs the clarity of the component layout, but also this wiring prevents the unhindered flow of cooling air onto the components.

DE 10 2009 054 011 B4 proposes a switch cabinet to solve this problem, in which the components being cooled are arranged on a support mechanism, having at its lower end a transition between the cold air pathway and the interior space of the switch cabinet, by which a majority of the cooled air provided in the cold air pathway is transported into the interior of the switch cabinet. Furthermore, a portion of the cooled air provided in the cold air pathway is taken through continuous openings in the mounting plate into the interior of the switch cabinet, such that certain components can be targeted according to their power dissipation. In this way, a more uniform temperature in the interior of the switch cabinet is also formed, instead of the above described temperature gradient in the vertical direction.

The solution known from DE 10 2009 054 011 B4 enables a greater degree of freedom in the arrangement of the components on the mounting plate thanks to the specific flow onto components in need of cooling, and this reduces the wiring expense. On the other hand, the familiar teaching provides no satisfactory cable management so that the flow can go unhindered to the components being cooled.

SUMMARY OF THE INVENTION

It is therefore the problem to be solved by the invention to further develop the switch cabinet of this kind so that besides specific flow onto components in need of cooling in the interior of the switch cabinet, a flow with the least possible losses is made possible, especially thanks to an improved cable management.

This problem is solved according to the invention by a combination cable and air channel for air conditioning a switch cabinet with an air channel and a cable channel which adjoins the air channel and which is led parallel to the air channel. A first longitudinal face of the air channel has at least one opening, and wherein one longitudinal face of the cable channel is a closure face which is locked in a removable manner. A corresponding switch cabinet includes a mounting plate which separates an interior space of the switch cabinet holding heat-producing components from a cooling air space. The interior space of the switch cabinet and the cooling air space are in fluidic connection across at least one passageway in the mounting plate. Cooled air from the cooling air space is led through the at least one passageway and an air inlet opening of the combination cable and air channel into the combination cable and air channel.

The combination cable and air channel according to the invention for air conditioning a switch cabinet has an air channel and a cable channel which adjoins the air channel and which is led parallel to the air channel, wherein a first longitudinal face of the air channel has at least one opening, and wherein one longitudinal face of the cable channel is a closure face which is locked in a removable manner.

A corresponding switch cabinet has a combination cable and air channel according to the invention as well as a mounting board, which separates an interior space of the switch cabinet holding heat-producing components from a cooling air space, wherein the interior space of the switch cabinet and the cooling air space are in fluidic connection across at least one passageway in the mounting board, and wherein cooled air from the cooling air space is led through the at least one passageway and an air inlet opening of the combination cable and air channel into the combination cable and air channel.

For example, the combination cable and air channel can be fastened to the mounting plate by the second longitudinal face of the air channel on the side of the interior space of the switch cabinet, so that the cable channel is arranged in parallel at a spacing from the mounting plate by a dimension of the air channel. The at least one opening can form an air passage in a direction parallel to the mounting plate.

Alternatively, the positions of cable and air channel can also be interchanged with regard to the last described variant, so that the combination cable and air channel can be fastened to the mounting plate by a longitudinal face of the cable channel on the side of the interior space of the switch cabinet, so that the air channel is arranged in parallel at a spacing from the mounting plate by a dimension of the cable channel. This variant is an option in particular for electrical components whose cold air intake region is situated upstream from the electrical connection region and thus at a distance from the mounting plate:

If the mounting plate separates an interior space of a switch cabinet from a cooling air space, an embodiment of the invention is conceivable in which the second longitudinal face of the air channel, by which the combination cable and air channel is placed on the mounting plate, has an air inlet opening for cooling air, so that the installation expense for the supply of cooling air to the air channel is minimized. However, other kinds of air supply to the air channel are also conceivable. In another embodiment, the air channel has an air inlet opening for cooling air, for example at its end face.

In one embodiment of the invention, the longitudinal face of the air channel has a plurality of openings which can be optionally broken open, provided with predetermined breaking points. Thus, in this embodiment, a largely standardized component is provided, with an arrangement of predetermined optionally broken openings, so that depending on the application the user at his own choice can open those openings situated near the component being cooled by pressing along the predetermined breaking points. Furthermore, the volume flow of cooling air taken to the component being cooled can be adapted by the number of openings broken open.

Preferably, the air channel has a rectangular cross section and a second longitudinal face, by which the combination cable and air channel can be mounted on a mounting face or on a wall of a switch cabinet, wherein the second longitudinal face extends perpendicular to the first longitudinal face of the air channel.

In one embodiment, the closure face of the cable channel extends in parallel at a distance from the second longitudinal face of the air channel. Especially favorably in this case, the closure face and the second longitudinal face form opposite outer faces of the combination cable and air channel. Thus, if the combination cable and air channel is fastened by the second longitudinal face of the air channel to a mounting plate, the cable channel is especially easily accessible via the closure face, since this is turned toward the installer.

Preferably, the combination cable and air channel is fashioned as a single piece. It can be provided in this case that the air channel and the cable channel are separated from each other by a wall element extending parallel to and spaced apart from the closure face and the second longitudinal face of the air channel.

In one embodiment of the invention, the openings are rectangular. The predetermined breaking points can be fashioned in U-shape. Furthermore, the openings can have a film hinge, so that when the openings are pressed along the predetermined breaking points the pressed part of the opening does not drop into the air channel, but instead can be pivoted along the film hinge into the air channel.

BRIEF DESCRIPTION OF THE DRAWINGS

Further details of the invention will be explained by means of the following figures. There are shown.

DETAILED DESCRIPTION OF THE INVENTION

Figure 1:
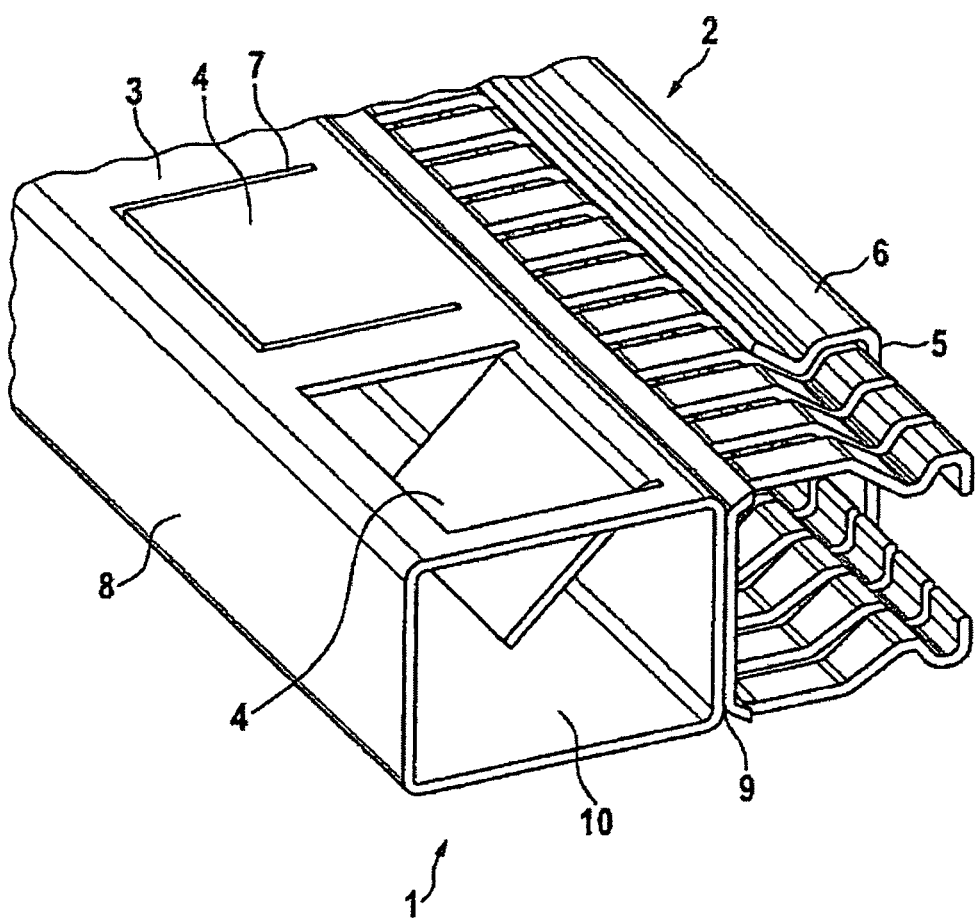
FIG. 1 a perspective view of an end segment of one embodiment of the combination cable and air channel of the invention.

The combination cable and air channel shown in FIG. 1 has an air channel 1 and a cable channel 2 adjoining the air channel 1 and being parallel to it. On a first longitudinal face 3 of the air channel 1 are fashioned a plurality of openings 4, which have predetermined breaking points 7. The predetermined breaking points 7 are such that on the one hand they are pressure-tight, but on the other hand the openings 4 can be indented by the finger or thumb wherever cooling air needs to be supplied to a particular component. For better clarity of the teaching according to the invention, the upper left opening 4 in FIG. 1 is shown with its predetermined breaking point 7 in the closed state, while the lower right opening 4 has already been indented. The predetermined breaking points 7 are recognizably fashioned in U-shape, the free ends of the predetermined breaking points 7 being joined together by a film hinge, so that when the openings 4 are pressed upon the indented part of the opening 4 does not drop into the air channel 1.

The closure face 6 is locked to the cable channel 2 and thus can be optionally removed and locked again for the outfitting of the cable channel 2. The closure face 6 extends parallel to the second longitudinal face 8 of the air channel 1, while the longitudinal face 8 and the closure face 6 form directly opposite outer faces of the combination cable and air channel. If the combination cable and air channel lies against a mounting plate 20 across the second longitudinal face 8 (see FIG. 2), the closure face 6 is turned directly toward the installer, who can easily grasp the cable channel 2.

The first longitudinal face 3 and the second longitudinal face 8 form directly perpendicular outer faces of the air channel 1, which is rectangular in cross section. If the combination cable and air channel, as shown in FIG. 2, is placed horizontally on the mounting plate 20 across the second longitudinal face 8, the first longitudinal face 3 also extends horizontally, so that air emerging via the openings 4 will flow out in the vertical direction and thus accomplish an optimal flow onto the components arranged above or below the combination cable and air channel, even those secured to the mounting plate.

The cable channel has foot elements at opposite longitudinal faces, which have an undercut at their free ends. The closure face 6 has a projection at opposite inner faces, by which the closure face 6 can be locked to the free ends of the foot elements.

Switch cabinet (11) with a combination cable and air channel according to one of the preceding claims and with a mounting plate (20), which separates an interior space (40) of the switch cabinet holding heat-producing components (30) from a cooling air space (50), wherein the interior space (40) of the switch cabinet and the cooling air space (50) are in fluidic connection across at least one passageway in the mounting plate (20), and wherein cooled air from the cooling air space (50) is led through the at least one passageway (60) and an air inlet opening (10) of the combination cable and air channel into the combination cable and air channel.

Figure 2:
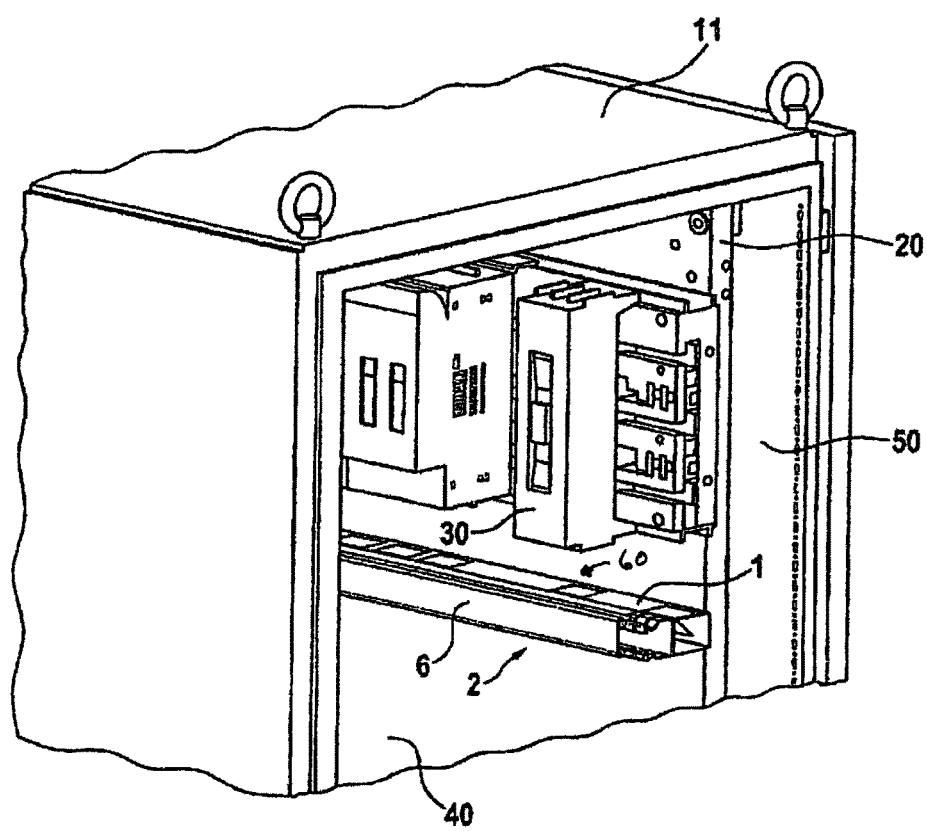
FIG. 2 a perspective view of the opened side wall of a switch cabinet having a combination cable and air channel per FIG. 1.
Figure 3:
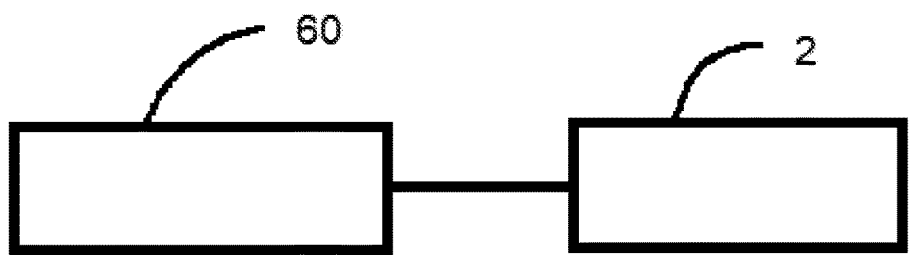
FIG. 3 a schematic view of a connection of and embodiment of an air supply line to an air conditioner.

The embodiment shown in FIG. 1 through 3 has an air channel 1 which has an air inlet opening 10 for cooling air at its end face. This air inlet opening 10 can be brought into communication with a cooling air supply line of an air conditioner 50. The cooling air supply line can be led alongside the mounting plate 20 and thus does not hinder the cooling air emerging via the openings 4. FIG. 3 schematically shows the air conditioner 50 connected to the air channel 1.

The features of the invention disclosed in the foregoing description, in the drawings, and in the claims can be essential in implementing the invention either individually or in any given combination.

LIST OF REFERENCE SYMBOLS 1 air channel
2 cable channel
3 first longitudinal face of the air channel
4 opening
5 longitudinal face of the cable channel
6 closure face
7 predetermined breaking point
8 second longitudinal face of the air channel
9 wall element
10 air inlet opening
11 switch cabinet
20 mounting plate
30 heat-producing components
40 interior space of switch cabinet
50 cooling air space

The invention claimed is:

1. A switch cabinet with a conduit comprising separate cable and air channels for air conditioning the switch cabinet, wherein the conduit comprising separate cable and air channels comprises:
   an air channel; and
   a cable channel which adjoins the air channel and which is led parallel to the air channel;
   wherein a first longitudinal face of the air channel has at least one opening, and
   wherein one longitudinal face of the cable channel comprises a portion of a closure face which is locked in a removable manner, while the air channel has a rectangular cross section and a second longitudinal face, by which the cable and air is channels are mounted on a mounting plate of the switch cabinet,
   wherein the second longitudinal face extends perpendicular to the first longitudinal face of the air channel, and wherein the air channel and the cable channel are separated from each other by a wall element extending parallel to and spaced apart from the closure face and the second longitudinal face of the air channel, and
   wherein the at least one opening forms an air passage directing air in a direction parallel to the mounting plate.

2. The switch cabinet according to claim 1, wherein the at least one opening in the first longitudinal face of the air channel comprises a plurality of openings which can be optionally broken open, provided with predetermined breaking points.

3. The switch cabinet according to claim 1, wherein the closure face of the cable channel extends in parallel at a distance from the second longitudinal face of the air channel.

4. The switch according to claim 1, wherein the at least one opening is rectangular and has predetermined breaking points arranged in a U-shape.

5. The switch cabinet according to claim 1, wherein the air channel has an air inlet opening for cooling air.

6. The switch cabinet according to claim 1, wherein the air channel has an air inlet opening for cooling air at one end face.

7. The switch cabinet according to claim 1, and with the mounting plate, which separates an interior space of the switch cabinet holding heat-producing components from supplied cooling air, wherein the interior space of the switch cabinet and the supplied cooling air are in fluidic connection across at least one passageway in the mounting plate.

8. The switch cabinet according to claim 7, wherein the conduit with cable and air channels is fastened to the mounting plate by the second longitudinal face of the air channel on the side of the interior space of the electrical enclosure, so that the cable channel is arranged in parallel at a spacing from the mounting plate by a dimension of the air channel.

9. The switch cabinet of claim 8, wherein the cable channel can be accessed through the closure face since the cable channel is spaced away from the mounting plate by the dimension of the air channel.

10. The switch cabinet according to claim 1, wherein the air channel is connected to an air conditioner to motivate air flow through the air channel.

11. The switch cabinet according to claim 1, wherein the conduit comprising separate cable and air channels is mounted on the mounting plate via the second longitudinal face of the air channel, so that closure face of the cable channel faces away from the mounting plate so that cables therein are accessible to a user.

12. The switch cabinet according to claim 1, wherein the closure face of the cable channel can be locked to the cable channel.

13. The switch cabinet according to claim 12, wherein the cable channel comprises foot elements, wherein each foot element comprises a free end which is provided with an undercut, and wherein the closure element comprises projections on an inner face thereof, and wherein the closure element of the cable channel is locked to the cable channel by engaging the projections of the closure element with the undercuts of the cable channel.

14. The switch cabinet according to claim 13, wherein the air channel is connected to an air conditioner to motivate air flow through the air channel.

15. The switch cabinet according to claim 1, wherein the second longitudinal face and the closure face form directly opposite outer faces of the combination cable and air channel.

16. The switch cabinet according to claim 1, wherein the first longitudinal face extends horizontally.

17. The switch cabinet according to claim 1, wherein the combination cable and air channel is formed as a single piece.

18. A conduit including cable and air channels for air conditioning a switch cabinet, comprising:
   an air channel; and
   a cable channel which adjoins the air channel and which is led parallel to the air channel;
   wherein a first longitudinal face of the air channel has at least one opening, and
   wherein one longitudinal face of the cable channel comprises a portion of a closure face which is locked in a removable manner, while the air channel has a rectangular cross section and a second longitudinal face, by which the combination cable and air channel can be mounted on a mounting plate or on a wall of a switch cabinet, wherein the second longitudinal face extends perpendicular to the first longitudinal face of the air channel, and wherein the air channel and the cable channel are separated from each other by a wall element extending parallel to and spaced apart from the closure face and the second longitudinal face of the air channel; and wherein at least one cable is guided longitudinally through the cable channel.

\* \* \* \* \*